US008325542B2

(12) United States Patent
Ogura et al.

(10) Patent No.: US 8,325,542 B2

(45) Date of Patent: Dec. 4, 2012

(54) COMPLEMENTARY REFERENCE METHOD FOR HIGH RELIABILITY TRAP-TYPE NON-VOLATILE MEMORY

(75) Inventors: Nori Ogura, Hillsboro, OR (US); Tomoko Ogura, Hillsboro, OR (US); Seiki Ogura, Hillsboro, OR (US)

(73) Assignee: Halo LSI Inc., Hillsboro, OR (US)

( * ) Notice: Subject to any disclaimer, the term of this patent is extended or adjusted under 35 U.S.C. 154(b) by 258 days.

(21) Appl. No.: 12/583,743

(22) Filed: Aug. 25, 2009

(65) Prior Publication Data

US 2010/0046302 A1 Feb. 25, 2010

Related U.S. Application Data

(60) Provisional application No. 61/189,960, filed on Aug. 25, 2008.

(51) Int. Cl.
*G11C 7/00* (2006.01)

(52) U.S. Cl. ....................................... 365/190; 365/202

(58) Field of Classification Search ............. 365/189.09, 365/190, 202, 185.28
See application file for complete search history.

(56) References Cited

U.S. PATENT DOCUMENTS 5,523,972 A 6/1996 Rashid et al.
6,009,011 A * 12/1999 Yamauchi ................ 365/185.01
6,490,204 B2 12/2002 Bloom et al.
6,584,017 B2 6/2003 Maayan et al.
6,954,393 B2 10/2005 Lusky et al.
7,149,126 B2 12/2006 Ogura et al.
7,352,033 B2 4/2008 Satoh et al.
7,371,642 B2 5/2008 Forbes
7,457,164 B2 11/2008 Ohta
7,468,914 B2 12/2008 Toda
7,471,581 B2 12/2008 Tran et al.
2003/0151950 A1 8/2003 Tamada et al.
2006/0023532 A1 2/2006 Hush et al.
2007/0008775 A1 1/2007 Telecco et al.
2007/0047307 A1 * 3/2007 Ogura et al. ............. 365/185.11
2007/0086238 A1 4/2007 Ohta
2008/0031075 A1 2/2008 Hong et al.

(Continued)

FOREIGN PATENT DOCUMENTS

WO PCT/US2009/004834 9/2009

OTHER PUBLICATIONS

Ogura, N.; Ogura, S.; Iwasaki, T.; Kikuchi, T.; Saito, T.; Matsuda, T.; Takimoto, K.; Nakagawa, K.; Ando, K.; Yamada, J.; , "N-Channel Complementary Pairing in Nitride Trap Memory," Non-Volatile Semiconductor Memory Workshop, 2008 and 2008 International Conference on Memory Technology and Design. NVSMW/ICMTD 2008. Joint , vol., No., pp. 77-78, 18-22.*

"N-Channel Complementary Pairing in Nitride Trap Memory," by Nori Ogura et al., 2008 IEEE, NVSMW.2008, pp. 77-78, 978-1-4244-1546-5/08.

*Primary Examiner* — VanThu Nguyen
*Assistant Examiner* — Khamdan Alrobaie
(74) *Attorney, Agent, or Firm* — Saile Ackerman LLC; Stephen B. Ackerman; Rosemary L. S. Pike

(57) ABSTRACT

Methods of complementary pairing of memory cells are described. These methods include two physical memory cells in a complementary pair, a complementary pair of reference cells for each erase block, and a physical complementary pair storing multiple data bits.

6 Claims, 14 Drawing Sheets

Start with 2 cells (M1 and M2)

Program both M1 & M2

Erase both M1 & M2

Repeat N times

Program both M1 & M2

|Vt(M1)−Vt(M2)| > tolerance ?

Yes

Program lower Vt cell weakly

No

Initialization done

U.S. PATENT DOCUMENTS

2008/0106937 A1 5/2008 Magnavacca et al.
2008/0142876 A1 6/2008 Arigane et al.
2008/0186763 A1 8/2008 Satoh et al.
2009/0121275 A1* 5/2009 Kim et al. .................... 257/321

* cited by examiner

COMPLEMENTARY REFERENCE METHOD FOR HIGH RELIABILITY TRAP-TYPE NON-VOLATILE MEMORY

This patent application claims the benefit of Provisional U.S. Patent Application Ser. No. 61/189,960, filed on Aug. 25, 2008.

FIELD OF THE INVENTION

This invention relates to a non-volatile memory cell with Twin MONOS structure; and more particularly to a non-volatile memory cell with Twin MONOS structure aiming at high reliability, high speed applications.

DESCRIPTION OF THE RELATED ART

Typical binary non-volatile memories have two possible threshold states, with high threshold voltage (Vt) for the logical 0 or OFF cell, and low Vt for the logical 1 or ON cell, as shown in FIG. 1. In order to read the memory state, a reference level or cell may be utilized, Ref, which lies midway between the two threshold distributions. Typically, a sense amplifier compares two input signals, one is the selected memory cell signal, and the other is the reference signal, in order to determine the logical state of the selected cell. The reference signal may be a fixed current signal or a fixed voltage signal or derived from a reference cell, which has characteristics similar to the memory cell. In order to obtain reliable, high speed operation, the reference cell needs to match the memory cell characteristics over variations in process conditions, capacitance and other parasitic loading effects, temperature, voltage, program/erase (P/E) cycling and retention conditions, etc.

Generally, nitride or insulator or trap type memories suffer from threshold voltage narrowing during cycling and after retention. FIG. 2 gives an example of measurement data taken from a Twin MONOS device as taught in U.S. Pat. No. 7,352,033 to Satoh et al, assigned to the same assignee as the present invention. The graph shows threshold distributions for program and erase after one million one-shot program and erase cycles 22, and then after high temperature retention bake 24. After the retention bake, window narrowing is observable. Before bake, the window A is 1.5V. After bake, the window B is 0.3V. This window narrowing is a unique characteristic due to the insulator nature of the storage medium. Floating gate type memories do not share this characteristic because the floating gate is composed of conductive polysilicon and electrons can move freely within the gate. In insulator or trap storage, charge is not as mobile, and excess electrons and holes can accumulate in regions within the storage medium. These excess charge buildups contribute to the instability of the threshold Vt of the memory cell, because over time, or at higher temperatures when hole mobility in the insulator increases, holes and electrons will recombine, and the overall threshold Vt of the memory channel will be degraded. Conventionally, at least one reference cell is reserved per erase block in order to closely track the cycling and retention characteristics of each memory block. U.S. Pat. No. 7,352,033 has a MONOS metal bit memory array, but the reference is not complementary. Prior art descriptions using a memory cell as a reference cell in nitride/trap type memories have been described in U.S. Pat. No. 5,954,393 to Perrin, U.S. Pat. No. 6,490,204 to Bloom et al, and U.S. Pat. No. 6,584,017 to Maayan et al. These patents describe the challenges of programming and erasing the reference cells. U.S. Pat. No. 7,457,164 to Ohta mentions using two reference cells having values of 0 and 1 for each word line, but a write verify operation is required. U.S. Pat. No. 7,471,581 to Tran et al teaches sixteen reference cells per page of memory.

Referring again to FIG. 2, the intermediate reference level is usually placed halfway between the worst-case program and erase threshold voltages. Therefore, for single sided conventional sensing of a selected memory cell compared against a “half-programmed” reference cell, the sensing threshold margin window is half of the worst case program and erase Vt window.

U.S. Patent Application 20070047307 to Ogura et al, assigned to the same assignee as the present invention, describes grouping of two adjacent memory cells into one complementary pair in order to achieve wider signal margins for high speed sensing. In this self-reference scheme, a bit of memory data Data<A> consists of two physical complementary bits (A,Ax) that are compared against each other through a sense amplifier or latch. This self-referencing method provides a highly reliable, straightforward read operation that tracks with temperature, cycling retention, and memory array parasitics and has a double sensing margin because the ON and OFF states are compared against each other instead of against an intermediate reference level, as shown in FIG. 3. FIG. 3 shows the program threshold voltage line 31 and the erase threshold voltage line 33. The conventional half current/voltage line 35 is shown between lines 31 and 33. In the conventional single-sided sensing 37, the cells are compared to the intermediate reference level 35. In the complementary pairing double signal window 39, the cells are compared against each other. U.S. Patent Application 2006/0023532 to Hush et al also describes a method of complementary memory cells. However, the memory is resistive instead of a trap type memory, with an application specifically to replace DRAM, and therefore needs architecture to match existing DRAM complementary device architecture.

“N-Channel Complementary Pairing in Nitride Trap Memory” by N. Ogura et al, p. 77-78, NVSMW.2008, p. 77-78, describes an additional advantage with a single level self-referencing complementary array is that with such improved margins, a simple one-shot Program/Erase scheme may be used without the need for Write verify.

The complementary method described above helps to improve the read and operation margins. However the additional memory cell size penalty is prohibitive, and runs counter to the industry’s trend towards higher density.

U.S. Pat. No. 5,523,972 to Rashid et al describes a multilevel (MLC) binary search method of reading and referencing four possible states in a single memory cell, which is also equivalent to storing two bits of data in a single cell. FIG. 4 shows the distributions of four different states in which each state has a different average threshold voltage, Vt_11, Vt_10, Vt_01, Vt_00. During read, there are three possible reference voltages, Ref_below lies between the Vt_11 and Vt_01 states, Ref_center lies between the Vt_10, and Vt_01 states, and Ref_above lies between the Vt_01 and Vt_00 states. In the binary search method, first the memory cell signal is compared against the center reference cell signal, Ref_center, and then depending on whether the memory cell threshold is determined to be above or below the center reference, the center reference signal is switched for a higher or lower reference signal level, Ref_above or Ref_below, respectively, to determine the second bit of data. In this way, the four states can be distinguished by two successive read sensing operations. This method has two serial reads to determine two bits, but they are contained in one physical cell, with one cell being compared against the middle reference first, and then a higher voltage if the output from the first read shows a higher VT, or a lower voltage if the output from the first read shows a lower VT.

U.S. Pat. No. 7,468,914 to Toda discloses an array of floating gate memory cells that has two reference cells and four levels of data per memory cell.

SUMMARY OF THE INVENTION

It is an object of this invention to describe a complementary reference operation method for an insulator or nitride or trap-type storage device that provides high reliability, high cycling and high read speed, by grouping two memory cells into a complementary pair.

It is a further object of this invention to describe a complementary reference method in which two reference cells are reserved for each erase block, which provides the same advantages of high reliability and cycling and high read speed, without the area penalty of a two memory cell complementary pair.

It is a still further object to describe a scheme that combines the concept advantages of complementary with N-bit multi-level storage, so that reliable read can be performed, even with narrow margins between the $2^N$ threshold voltage levels.

In accordance with the objectives of the invention, a method of complementary pairing of memory cells is achieved. Two physical memory cells are provided in a complementary pair wherein both of the memory cells are in an erased state. An initialization sequence is performed on the complementary pair to minimize the threshold voltage offset between the two cells in the complementary pair. In order to create a complementary data value, one of the memory cells in the complementary pair is programmed while the other remains erased. Thereafter, the two cells in the complementary pair are compared with each other using a sense amplifier to determine which side is programmed and which side is erased.

Also in accordance with the objectives of the invention, another method of complementary pairing of memory cells is achieved. A set of two reference cells per erase block is provided wherein a first reference cell has a value of '1' and a second reference call has a value of '0'. A selected memory cell in the erase block is compared to the two reference cells to determine whether the memory cell has a value of '0' or '1'.

Also in accordance with the objectives of the invention, another method of complementary pairing of memory cells is achieved. N bits of data are stored in a complementary pair of memory cells wherein the number of levels stored in the pair is $2^N$ and wherein the number of level pair groupings is $2^{N/2}$.

Also in accordance with the objectives of the invention, a memory cell array using complementary pairing of memory cells is achieved. Two physical memory cells are provided in a complementary pair wherein both of the memory cells are in an erased state. In order to create a complementary data value, one of the memory cells in the complementary pair is programmed while the other remains erased. A comparator compares the two cells in the complementary pair with each other to determine which side is programmed and which side is erased.

Also in accordance with the objectives of the invention, another memory cell array using complementary pairing of memory cells is achieved. An array of memory cells comprises a set of at least two reference cells per erase block of memory cells wherein a first reference cell has a value of '1' and a second reference cell has a value of '0'. A comparator compares a selected memory cell in the erase block to the two reference cells to determine whether the selected memory cell has a value of '0' or '1'.

BRIEF DESCRIPTION OF THE DRAWINGS

In the accompanying drawings forming a material part of this description, there is shown.

DESCRIPTION OF THE PREFERRED EMBODIMENTS

Figure 1:
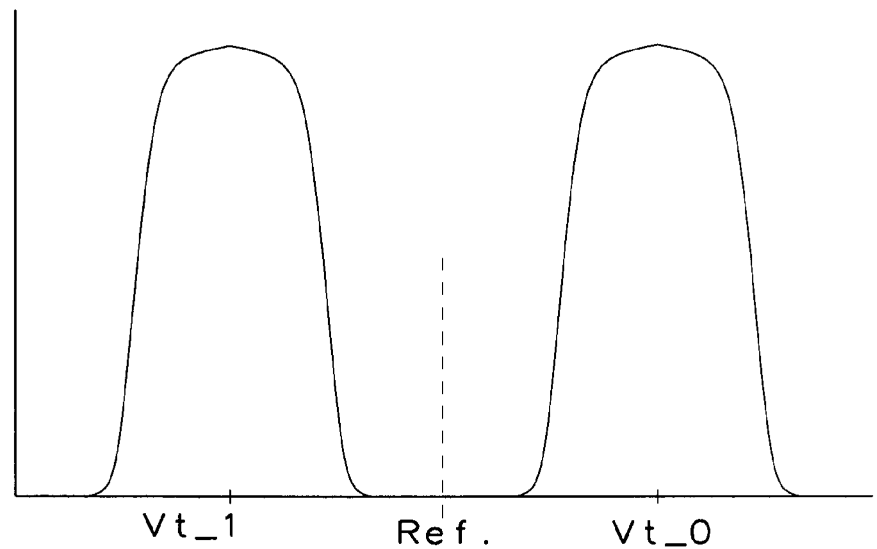
FIG. 1 describes the threshold distribution windows for the ON and OFF states in a conventional binary non-volatile memory.

The invention will be described with reference to the drawing figures, as follows. The first embodiment of the present invention is a complementary pair grouping that will be described with reference to FIGS. 5, 6, 7, 8A and 8B. The second embodiment of the invention comprises a pair of complementary reference cells and will be described with reference to FIGS. 9-15. The third embodiment extends complementary self-referencing to multi-level sensing and is described with reference to FIGS. 16-20.

Figure 5:
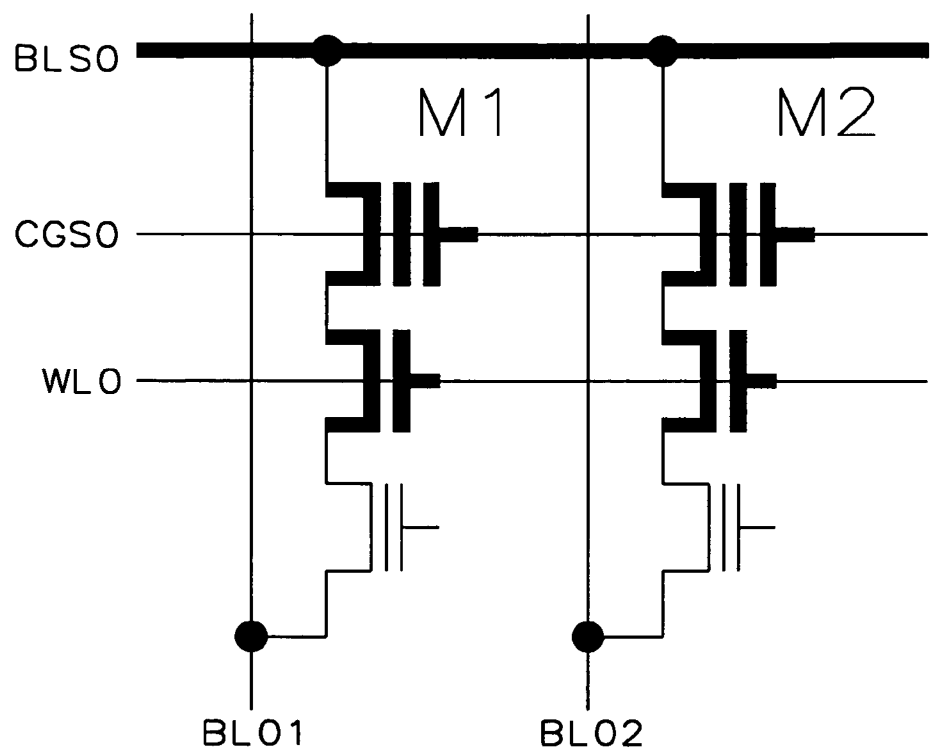
FIG. 5 shows an example of complementary pair grouping in a Twin MONOS NOR array schematic.

FIG. 5 shows a circuit schematic diagram of Twin MONOS memory cells organized in a NOR array. It is possible to arrange the memory cells in other types of arrays, such as virtual ground or AND or NAND, etc, but a NOR-type array will be used for this explanation. Two cells M1 and M2 are chosen to be a complementary pair. When M1 is programmed, then M2 is erased, and vice versa. The threshold window between M1 and M2 is defined by delta Vt=Vt(M1)−Vt(M2).

Figure 2:
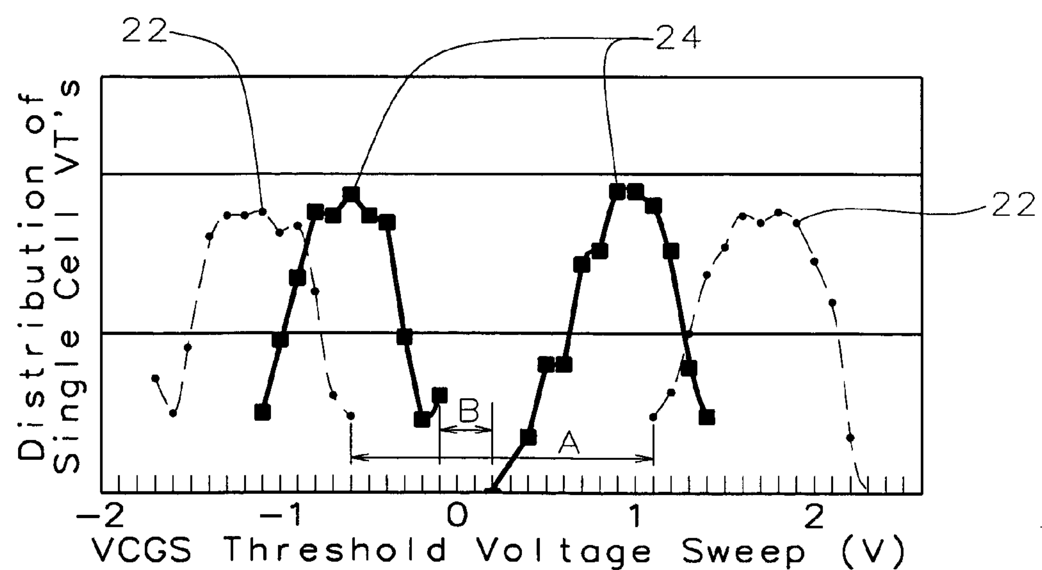
FIG. 2 shows threshold voltage distribution characteristics for a typical Twin MONOS nitride memory before and after 1 million cycles and retention bake.
Figure 3:
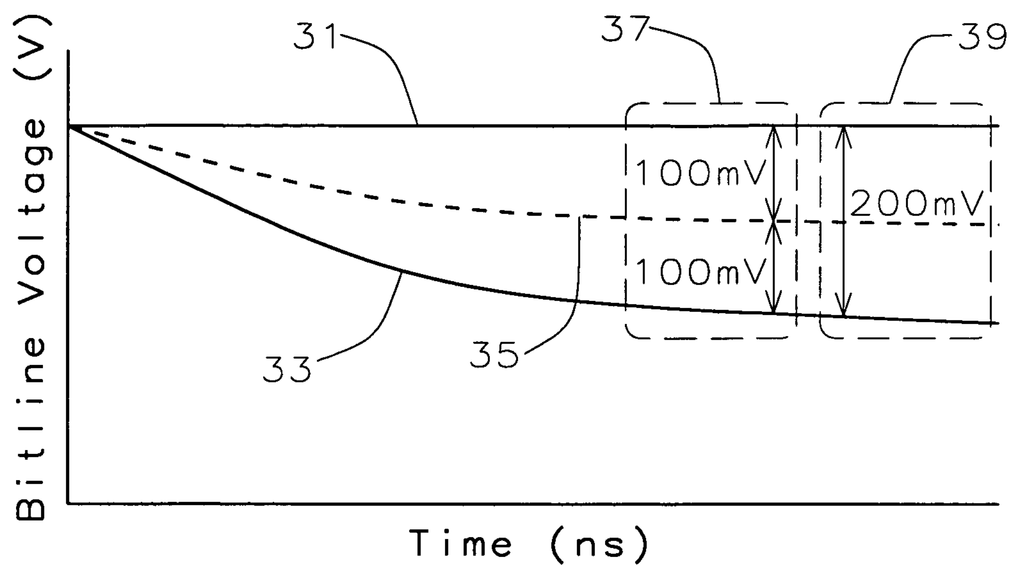
FIG. 3 describes the double signal sensing window that can be obtained by the complementary pairing method, described in prior art.
Figure 4:
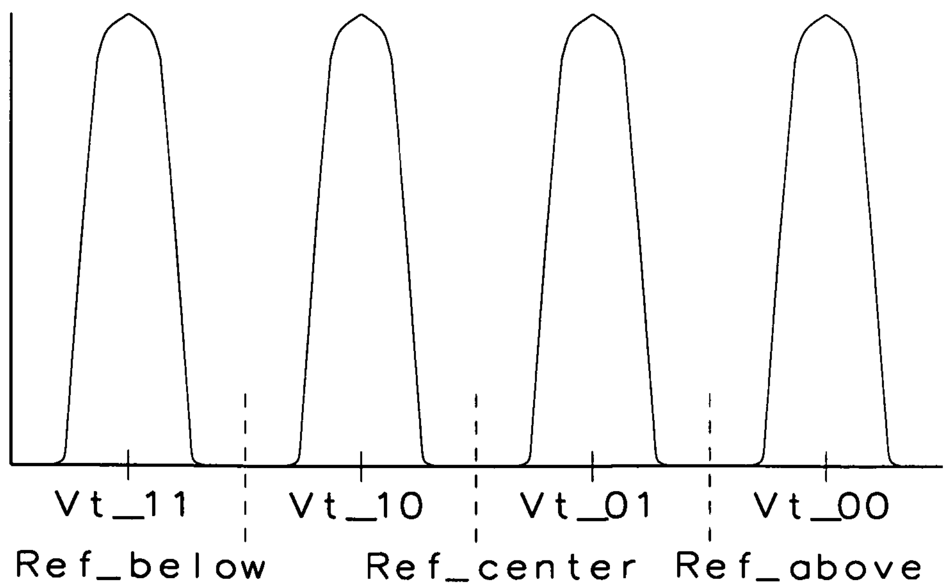
FIG. 4 shows a conventional memory threshold distribution for 2-bit, 4 level multi-level storage implementation.
Figure 6:
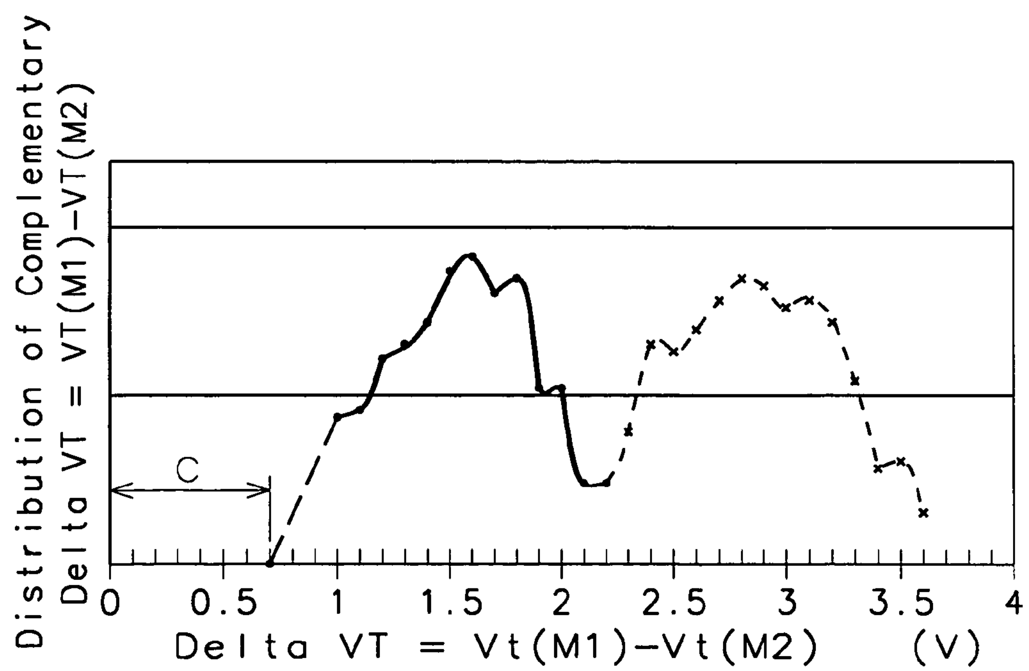
FIG. 6 shows the delta Vt distribution for the same data in FIG. 2, after complementary pair grouping.

FIG. 6 shows a distribution of delta Vt for the same data from the graph given in FIG. 2. Referring back to FIG. 2, the difference between the worst case points in the end-of-life program and erase distributions is 0.3V. Given an intermediate reference cell placed halfway within the 0.3V, the sensing margin window is about 0.15V. However, when the delta Vt is plotted for the same sample, the worst-case delta Vt C after cycling and retention is 0.7V. Thus, complementary pairing can provide more than 4× the signal window as by the conventional single-sided read, even without using program and erase verify operations. Program and erase verify are conventional methods employed in order to tighten up the program and erase threshold distributions and thus improve the worst-case window.

With such a large operation window, program and erase verify operations are no longer necessary. This circuit simplification can greatly reduce the peripheral logic complexity and area.

The reason for the improvement in the operation window by delta Vt is that two cells in a complementary pair are highly likely to program and erase at similar speeds, due to their similar physical characteristics and the statistical nature of nitride trap storage P/E program mechanisms. Of course, it is important to choose two cells that have similar channel length and edge effects. For example, due to misalignment effects, sometimes even-bit addressed cells may have different characteristics than odd-bit address cells. However, differences in physical characteristics with a pair such as channel length variations or unevenness in the film layers, or array edge effects, are only one component of the offset threshold voltage.

Figure 7:
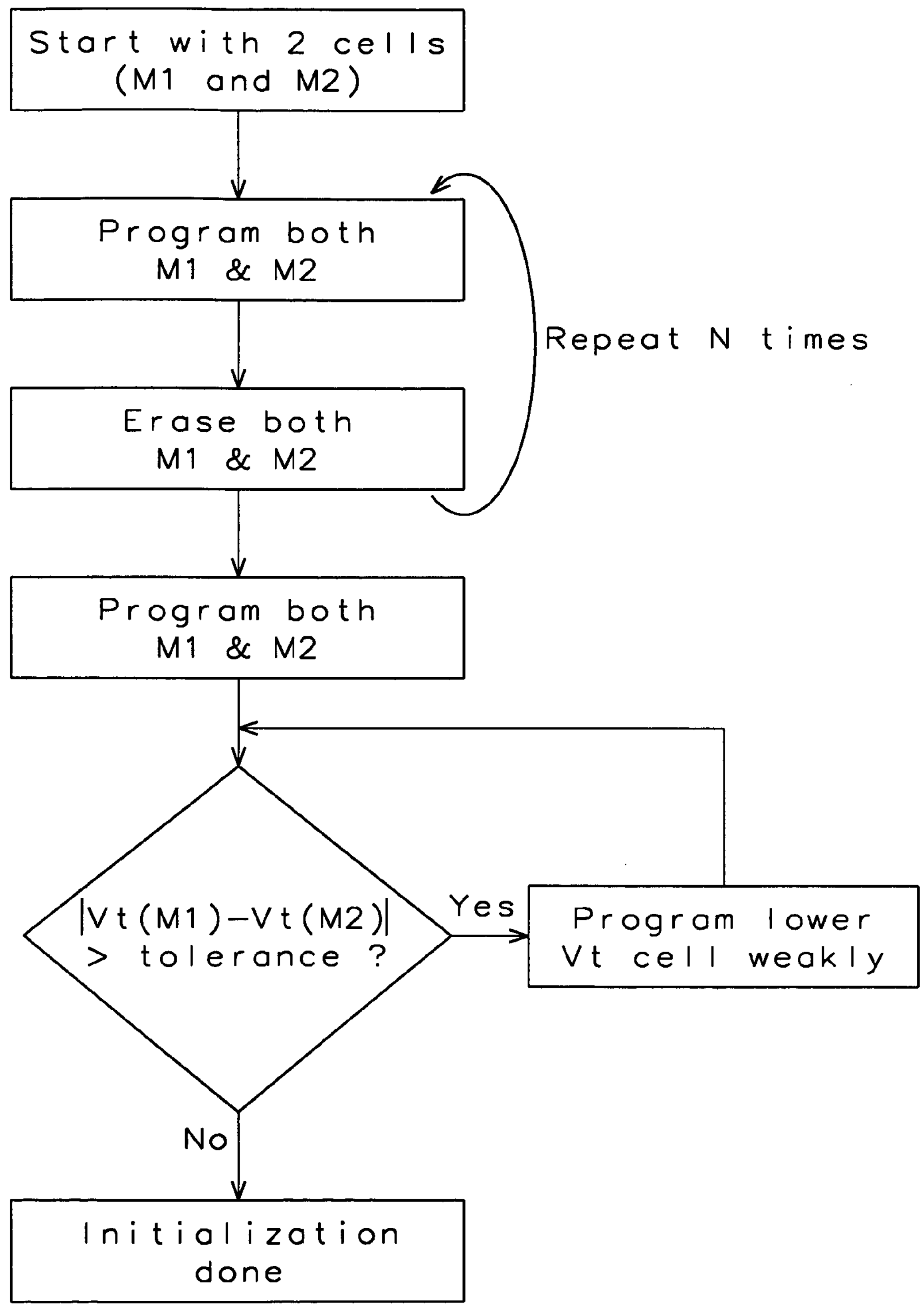
FIG. 7 shows a state diagram to initialize the complementary pair to maximize the delta Vt window.

From data, it has been observed that a major cause of the offset threshold voltage in the pair is due to non-physical variations, like plasma charging effects during wafer processing. Again, this effect is a unique characteristic of nitride or insulator trap type memories. During processing, high energy electrons can become trapped in the memory cell nitride on a cell-by-cell basis. This type of offset can be removed by implementing program verify in an initialization sequence. FIG. 7 describes an initialization sequence that could be used to reduce the inherent threshold difference between two cells in a complementary pair. First the memory pair is cycled together an N number of times, where N can be any number from 0 to about 20, in order to stabilize the P/E operations after wafer processing. After that, both memory cells are programmed, and the threshold voltages of both memory cells are obtained through a read sweep. If the difference between the memory cell thresholds is greater than a given tolerance, then the memory cell with the lower Vt is slightly programmed further until the difference between the two cells, or the delta Vt, falls within the acceptable tolerance level.

Figure 8A:
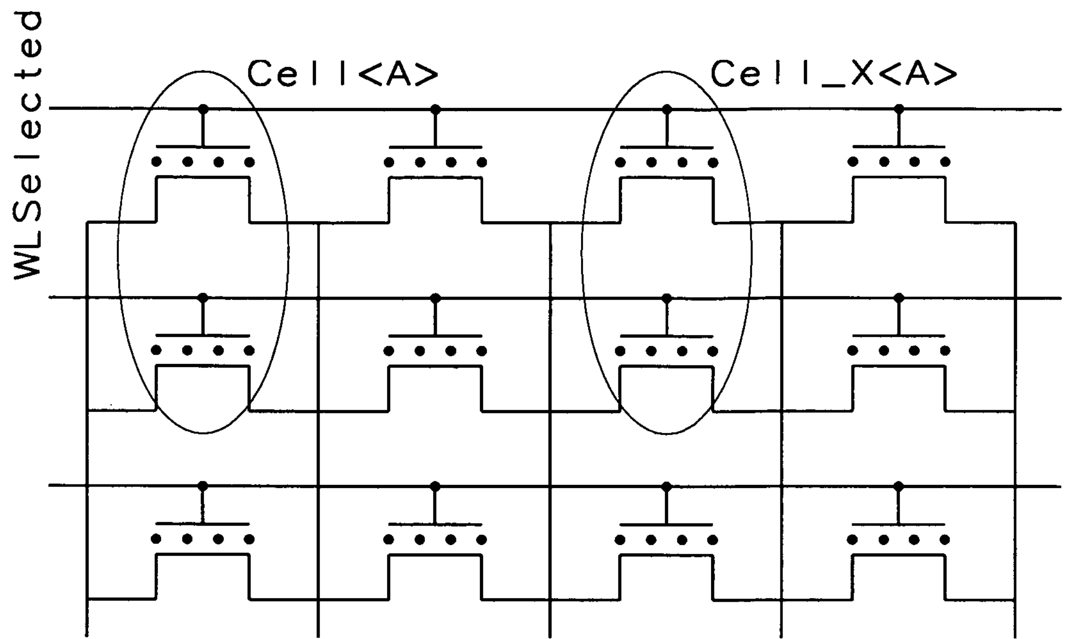
FIG. 8A shows an implementation of 1:1 complementary pair grouping based on a general non-volatile memory, virtual ground array.
Figure 8B:
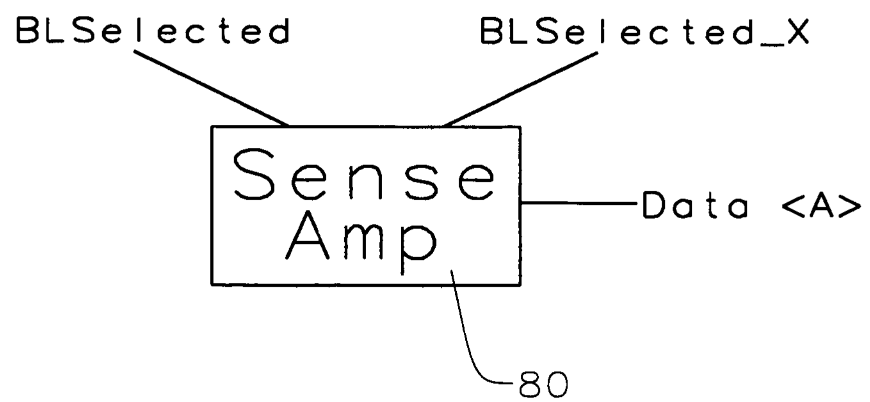
FIG. 8B shows a circuit block diagram for the implementation of FIG. 8A.

FIGS. 8A and 8B show an implementation of complementary pair grouping based on a more general type of non-volatile memory, organized in a virtual ground array. The reference cell CELL_X<A> may be located in the data array as in the prior art embodiment of complementary self-reference array. The complementary reference may or may not be located anywhere inside of the data array, so long as the bit line BLSelected for the selected bit Cell<A> is separate from the bit line BLSelected_X of the reference bit Cell_X<A>, since the two bit lines are compared against each other by the sense amplifier 80 in FIG. 8B. The ratio of memory cell to complementary is 1:1, which means that each complementary pair consists of two physical memory cells. During the initialization process before programming the complementary data, the two cells should be near the same value so that when one side is programmed, the difference between the two cells can be maximized. One side is supposed to be programmed and the other side is supposed to be erased when reading the state that has complementary data. They can be compared either against each other or against another reference cell to determine what the state is.

Figure 9A:
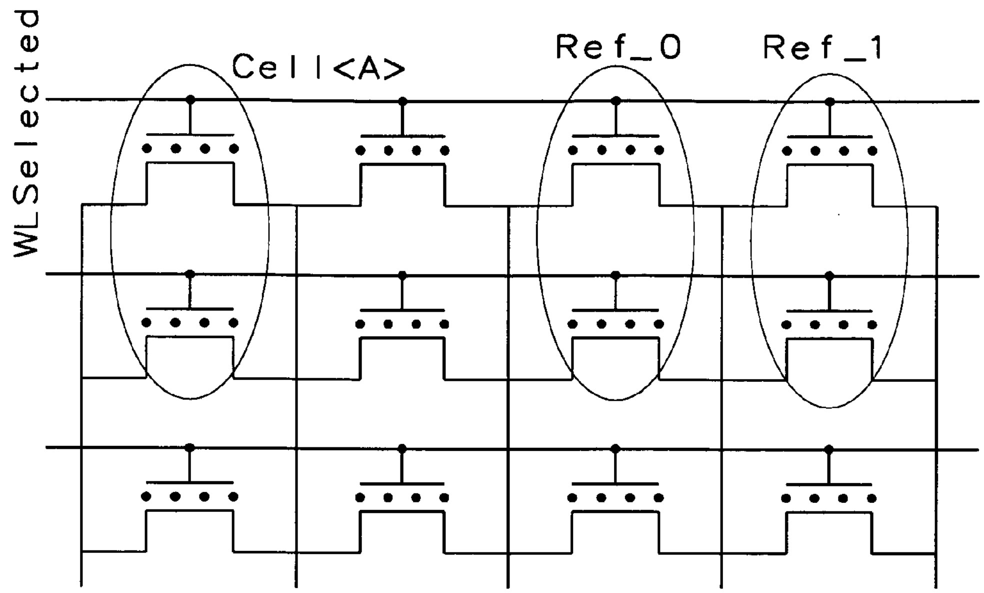
FIG. 9A shows an implementation of hybrid X:1 complementary pair grouping on a general non-volatile memory, virtual ground array.
Figure 9B:
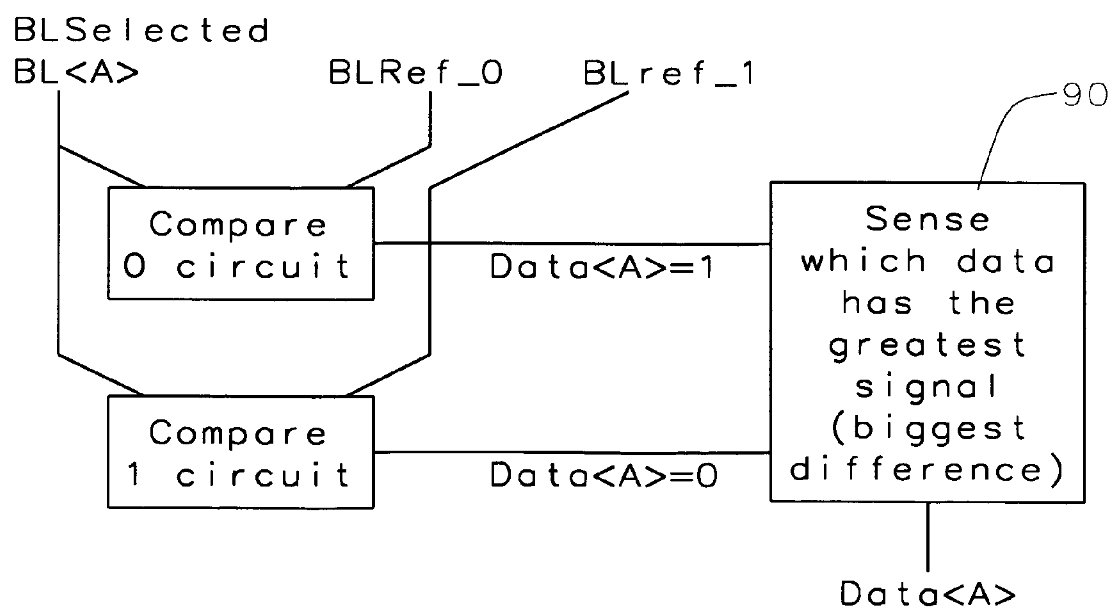
FIG. 9B shows a first alternative circuit block diagram for the implementation of FIG. 9A.

FIG. 9 shows an implementation of complementary pair grouping in a second preferred embodiment of the present invention, which provides the same advantages of wide window due to delta Vt, without requiring an extra cell per memory cell. The ratio may increase from X:1, depending on how many cells out of the array are chosen to be reference cells for a corresponding read unit. More cells out of the array may be chosen as reference cells for better matching throughout the array. If the reference cells match the array, it minimizes loss of sense margin due to differences in array parasitics or differences in device characteristics.

As in the complementary array embodiment, the data cell of unknown state (0 or 1) will be compared against its corresponding reference cell. In this embodiment, each reference cell will consist of a known pair of complementary data of both states 0 and 1. A selected cell in the memory array will be compared to both states of a complementary reference. For a binary state read, one of the complementary reference bits will be the complement of the read data bit, the other side will be the same state as the read data bit. Both complementary references may be compared against a bit, resulting in one valid output from the reference side complementary to the selected bit, and the other output from the reference comparison invalid. The valid complementary data will work the same way as the normal self-reference scheme, with comparison through a sense amp or data latch; the margin and tracking will have those benefits as with the complementary self-referencing scheme. The valid data will need to be identified and latched, while the invalid data will need to be identified and then disregarded.

In the preferred embodiment of the invention, there will be at least two reference cells per erase block. The key feature of the present invention is in the sensing method. Usually reference cell thresholds are parked "halfway" between the program and erase states. In this invention, the reference cells are all-the-way programmed or all-the-way erased. The selected memory cell is compared against both a programmed reference cell and an erased reference cell, and the difference with the smaller magnitude difference, wins.

The requirements for a valid data side would be for the complementary reference side which has the greatest difference between the selected data bit. That would occur for complementary bits. If the bits were the same state, the memory cell characteristics would have more similar cell current and voltage. Thus the difference in complementary reference 1, would need to be compared against the difference in complementary 2, and the output from the pair with the greatest difference should be obtained. In the first embodiment, this could be done by a voltage subtractor circuit for each pair1 and pair2. The pair with the smallest difference would be identified, and bit line comparison from that valid pair would be sensed and chosen.

Figure 10:
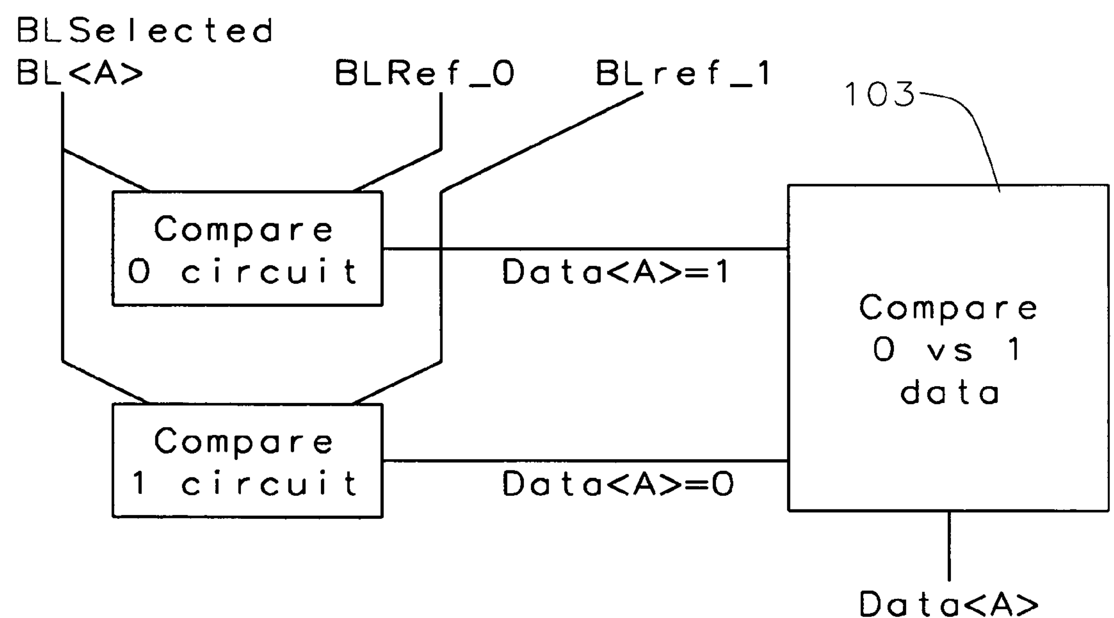
FIG. 10 shows a second alternative circuit block diagram for the hybrid X:1 complementary pair grouping method.

FIG. 10 shows another embodiment of this invention; the valid data is similarly chosen for the largest difference, through two stages of sense amplifiers. The first stage of sensing uses a sense amplifier 101 to compare the selected bit against each of the two complementary reference cells. The outputs of the two sense amplifiers 101 are then compared against each other in the second stage sense amplifier 103, thereby identifying the valid reference output with the largest delta voltage/current. The sense amplifiers used may be either voltage or current sense amplifiers.

Figure 11A:
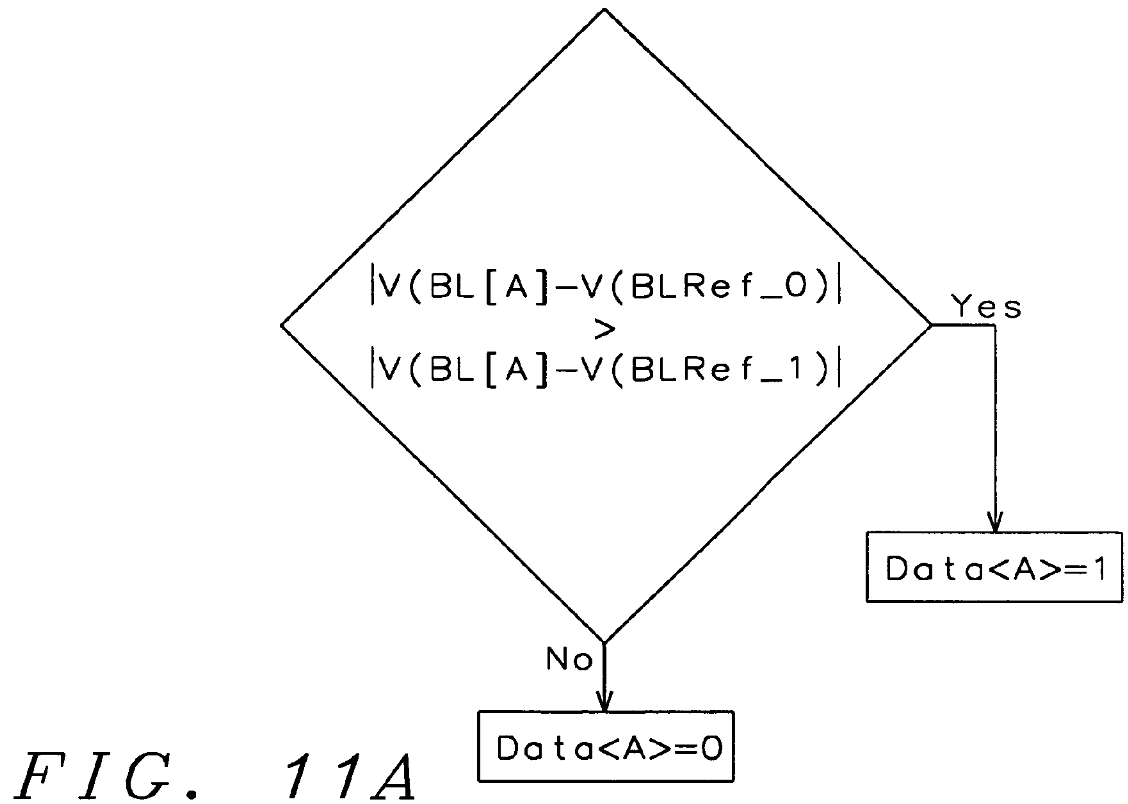
FIGS. 11A and 11B gives logical equation summaries of the function of the comparator and sense amplifier circuits in two alternatives in the hybrid X:1 complementary pair group method.
Figure 11B:
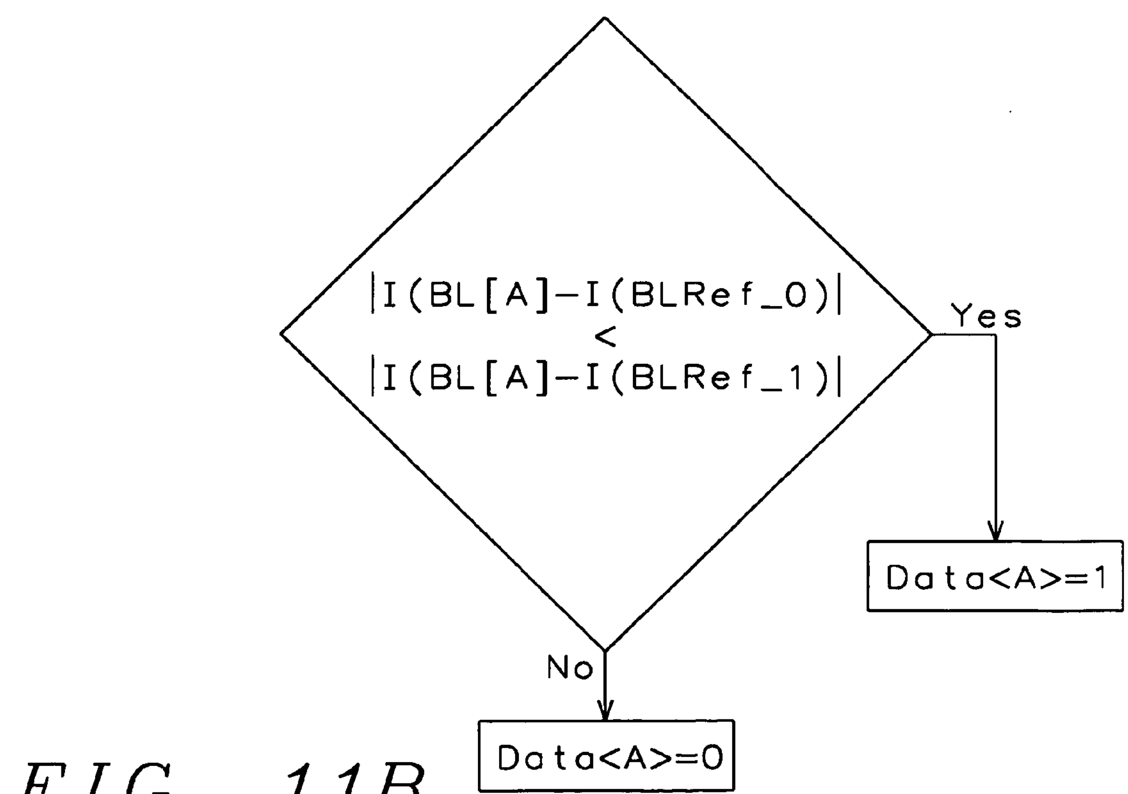

FIG. 11A gives a summary of the logical equations that should be applied by the sense amplifiers for the voltage sensing situation. FIG. 11B gives a summary of the logical equations that should be applied by the sense amplifiers for the current sensing situation.

Figure 12:
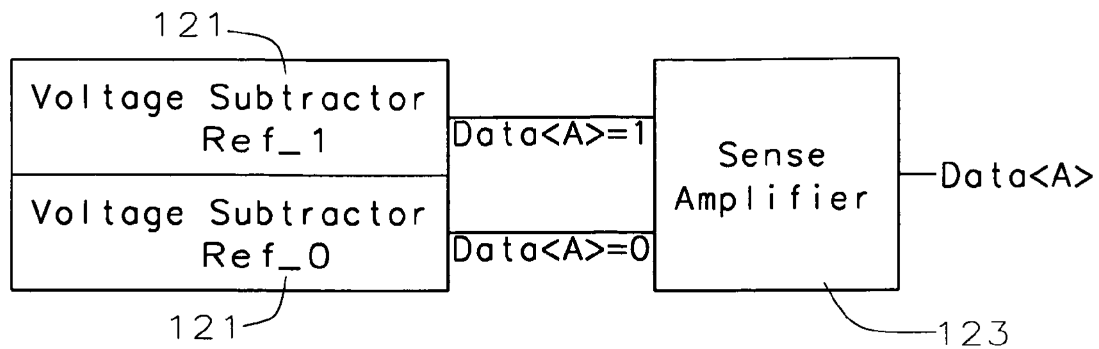
FIG. 12 shows a third alternative circuit block diagram for the hybrid X:1 complementary pair group method.

FIG. 12 shows that the compare stage can be implemented by voltage subtraction circuits 121. The sense amplifier 123 compares the outputs of the voltage subtraction circuits 121 to determine the valid reference output.

Figure 13:
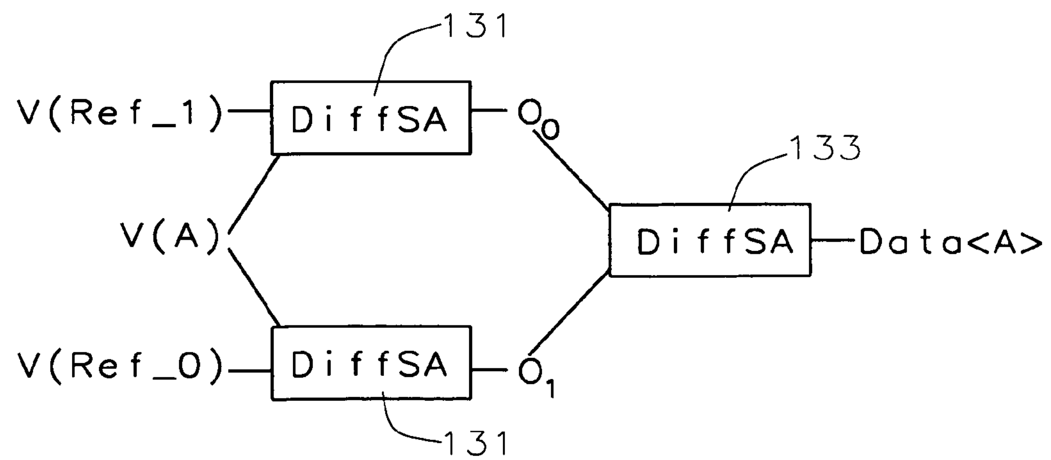
FIG. 13 shows a fourth alternative circuit block diagram for the hybrid X:1 complementary pair group method.

FIG. 13 shows that the first compare stage can be implemented using differential sense amplifiers 131. Differential sense amplifier 133 compares the outputs of the differential sense amplifiers 131 to determine the valid reference output.

Figure 14:
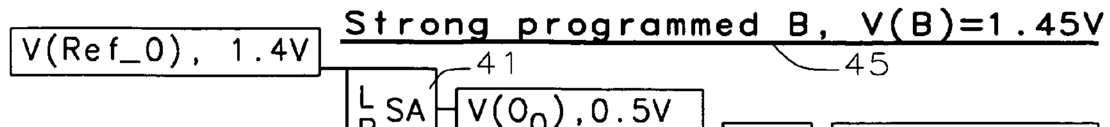
FIG. 14 gives a summary example of the hybrid X:1 complementary pair group method.
Figure 14:
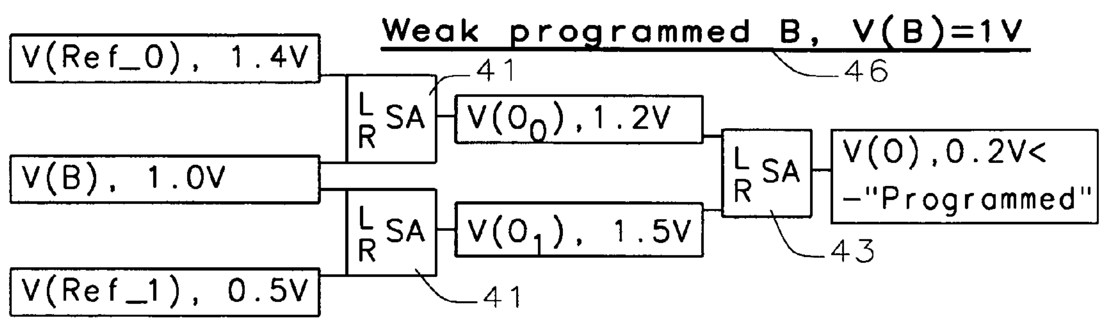
Figure 14:
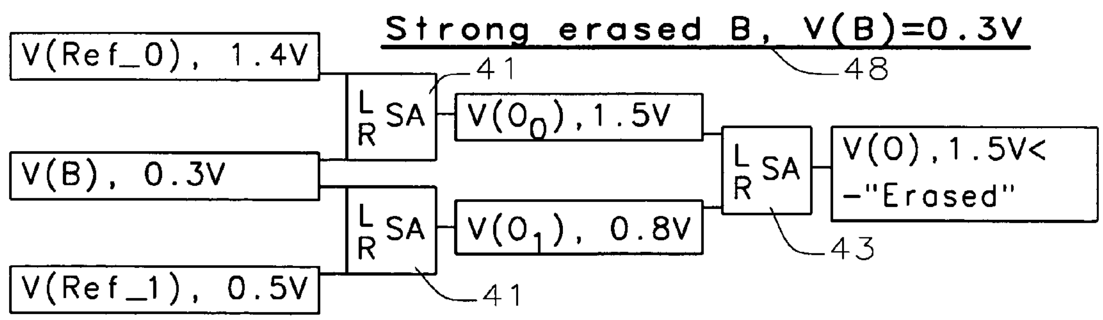
Figure 14:
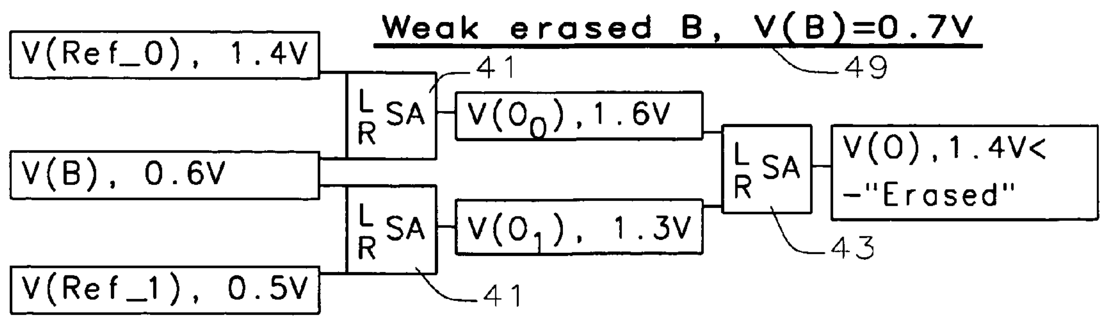

FIG. 14 gives an example of how this complementary referencing method could work. In the pre-charge-discharge read sensing method, all bit lines are precharged to around 1.4V, and then the selected memory cell and the two reference cells are activated at the same time.

Ref0 is preset to 1.4V and Ref1 is preset to 0.5V. V(B) is the bit line voltage coupled to the selected memory cell at the time of sensing, V(Ref0) is the bit line voltage coupled to the programmed reference cell at the time of sensing, and it is assumed that the programmed reference cell will have a high threshold voltage, and thus the bit line voltage will not fall very much. V(Ref1) is the bit line voltage coupled to the erased reference cell at the time of sensing, and it is assumed that the erased reference cell will have a very low threshold voltage, and thus the bit line voltage will fall the most. The bit line voltages are input into a first stage of differential amplifiers 41, and then the outputs of the first stage $V(O_0)$ and $V(O_1)$ are input to a second stage differential amplifier 43. In this example, if the output of the second state differential amplifier V(O) is less than 0.6V, then the memory cell B is determined to be programmed, otherwise the memory cell B is determined to be erased. Four examples are shown in FIG. 14: strong programmed 45, weak programmed 46, strong erased 48 and weak erased 49. It is possible to implement the second state differential amplifier with other switch point trigger mechanisms.

The pairing of the reference cell within the memory array needs not be limited to a cell that is immediately adjacent to the selected bit. For matching array parasitics of capacitance and resistance, however, it is recommended that the reference cells be near the area of the selected bits.

The placement of the reference cell within the memory array also helps to match with each functional unit of memory. While one word line (WL) is read at once, a pair of bit lines (BL's) out of the array could be potentially chosen as the reference bit line. Since the edge of the array often has shown the worst characteristics of the memory, the edge BL's could potentially be used for the complementary reference for the rest of the data array.

Figure 15:
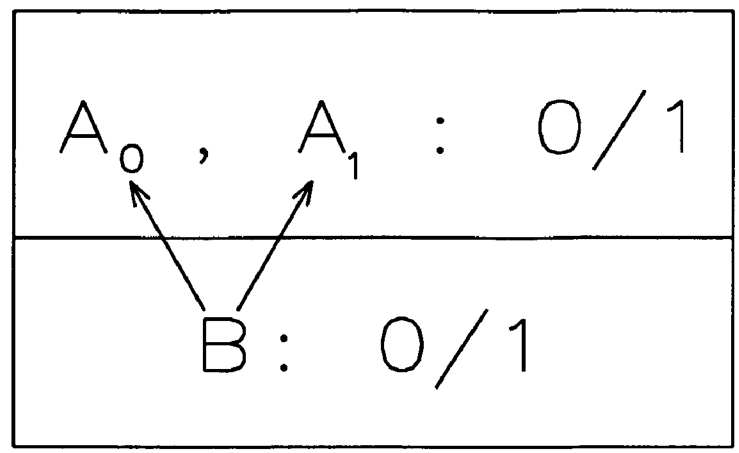
FIG. 15 shows another variation of the hybrid complementary in a single level bit array.

FIG. 15 shows another variation of the hybrid complementary in the single level bit array. In this variation, the memory array is a combination of Complementary bits A and single bit B. A0 is compared against A1. A voltage subtractor compares B against A0 and A1. If V(A0)−V(B)>V(B)−V(A1), then the smaller subtractor result is discarded. This is a variation of the embodiment where each cell is a complementary pair—some bits are complementary, and some are not.

Figure 16:
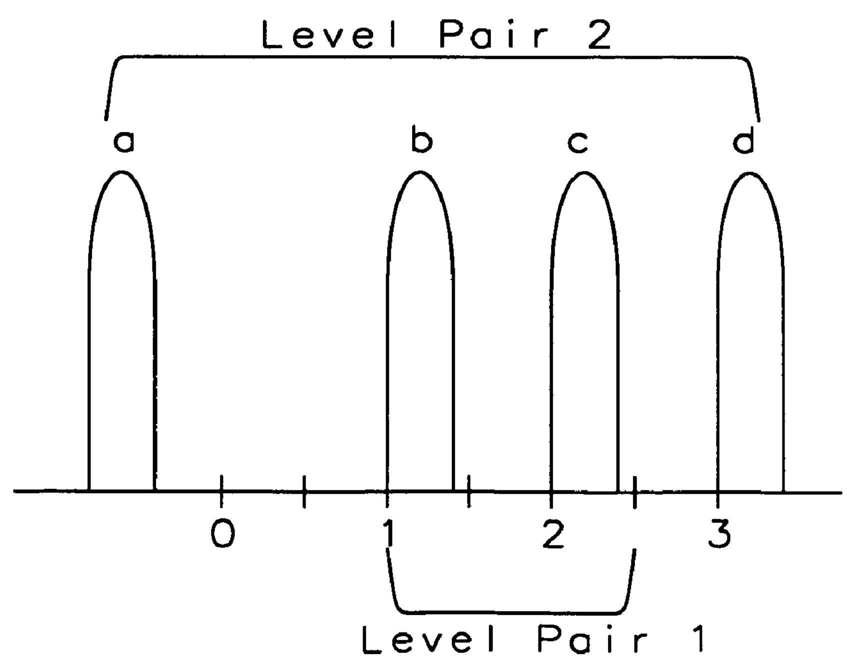
FIG. 16 shows a threshold distribution for 2-bit multi-level storage.

In another embodiment of this invention, the concept of complementary self-referencing can be further extended to multi-level sensing. FIG. 16 shows a threshold distribution profile for 2-bit or four level memory storage. The voltages and ranges are given for illustration purposes only, and should not be construed as limiting in any way. The lowest distribution a has a maximum threshold voltage of 0V, after cycling and retention, and the second lowest distribution b has a minimum threshold voltage of about 0.8V and a maximum threshold voltage of about 1.4V. The next threshold distribution c has a minimum threshold voltage of about 1.8V and a maximum threshold voltage of about 2.4V. The highest distribution d has a minimum threshold voltage of 2.7 and a maximum threshold voltage of about 3.4V. Distributions a and d are stored as a pair, and distributions b and c are stored as a pair. Here, one pair is defined as two memory cells where one memory cell is referred to as "top" and the other memory cell is referred to as "bottom". The top and bottom cells have corresponding individual top and bottom bit lines, as well as corresponding individual top and bottom gates. Table 1 shows the binary data values that can be assigned to each pair grouping.

TABLE 1

| Pair | Top Vt | Bot Vt | Value |
|---|---|---|---|
| 1 | a | d | 11 |
| | d | a | 00 |
| 2 | b | c | 10 |
| | c | b | 01 |

Figure 17:
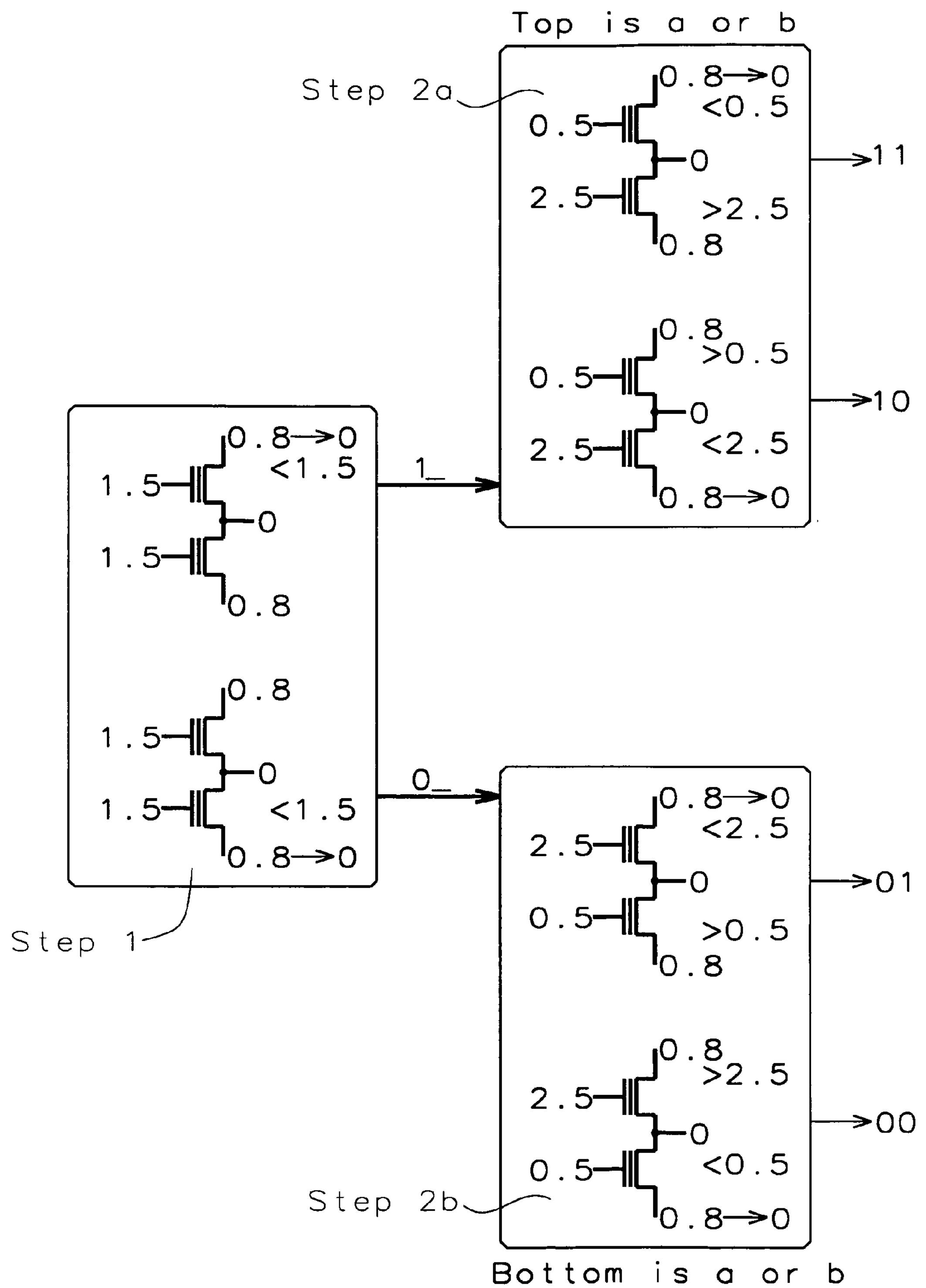
FIG. 17 shows the read method voltages applied in two steps to sense the 2-bit multi-levels.

FIG. 17 shows the method to read in two successive steps. In pre-charge/discharge read, first both the top and bottom bit lines are precharged to an intermediate voltage; 0.8V has been chosen for this example. The common diffusion between the two memory cells is connected to a fixed voltage, such as 0V. The outer top and bottom bit lines are connected to the inputs of a simple differential sense amplifier. In Step 1, the center reference voltage is applied to the gates of the top and bottom cells, in order to determine which of the two memory gates has the higher threshold voltage. If the top threshold voltage is higher than the bottom threshold voltage, than the voltages in Step 2*b* are applied to the control gates, otherwise Step 2*a* is used. In this way, the data within the complementary pair can be determined. In Step 2, the gates have different voltages, 0.5 and 2.5, applied, and the bit line outputs on the top and bottom gates are complementary ~0.8V, ~0V.

Figure 18:
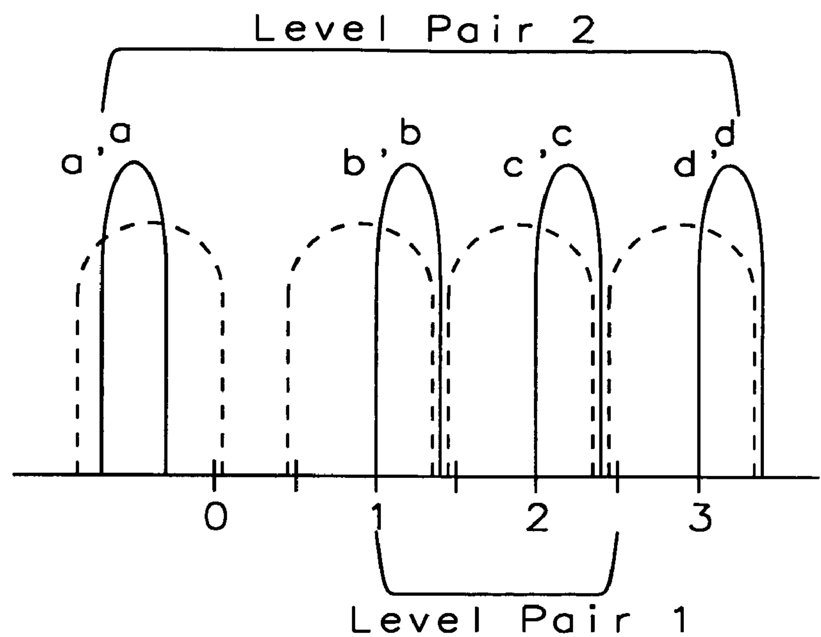
FIG. 18 shows a threshold distribution for 2-bit multi-level storage after cycling and retention.

As in single level complementary referencing, Step 1 compares the state of complementary data between the top and bottom devices. The read can be as described earlier comparing against each other, or comparing each bit against a reference. This data is stored as the first bit of data, and the second step commences to see if the complementary data is a wide margin level pair 2 data or small level 1 pair data (FIG. 18). The output of this second step gives the second bit of data in the 2 bit multi-level data. The sense method is similar to that of the first step, however the low gate voltages (Ex: ~0.5V) between the low voltage values of level pair 2 and level pair 1, is applied to the side that is determined to be low from Step 1. Simultaneously, the high gate voltage (Ex; ~2.5V) between the high voltage values of level pair 2 and level pair 1, is applied to the side that is determined to be high from Step 1. The complementary data from the top and bottom cells are compared against each other, giving the second bit of data. The pair 2 bit/2 cells, would have a net result of 1 bit/cell, which would improve the penalty of doubling of area for regular complementary array.

In FIG. 17, only the memory gates have been drawn, but it is also possible to add a separate select gate within the memory cell. It is possible to read the memory cell in both the forward and the reverse directions, but reversing the biases of the source and drains. For example, the common diffusion voltage can be fixed to 0.8V instead of 0V, and the top and bottom bit lines could be precharged to 0V, instead of 0.8V. Furthermore, the pre-charge/discharge sensing method is shown here for illustration, but it is also possible to extend this approach to other read methods such as source-follower or current sensing.

This multi-level complementary method provides a very reliable read, even if the threshold voltages shift with cycling and retention. FIG. 18 shows an example of how the positive threshold voltages may shift down with cycling retention while the negative threshold voltages might shift up with cycling and retention (shown by dashed lines). In this extreme illustration, even if the threshold voltages were to shift past the actual reference levels, because sensing operations are performed relative to each other, the read value would still output correctly. Generally, for conventional multi-level implemented by a single-sided select, if one threshold voltage level shifts, then the read will output incorrectly, or the reference cells will also need to be recalibrated in some way. Here, it is possible to keep using the same reference levels, which simplifies the reference circuits and peripheral logic.

Figure 19:
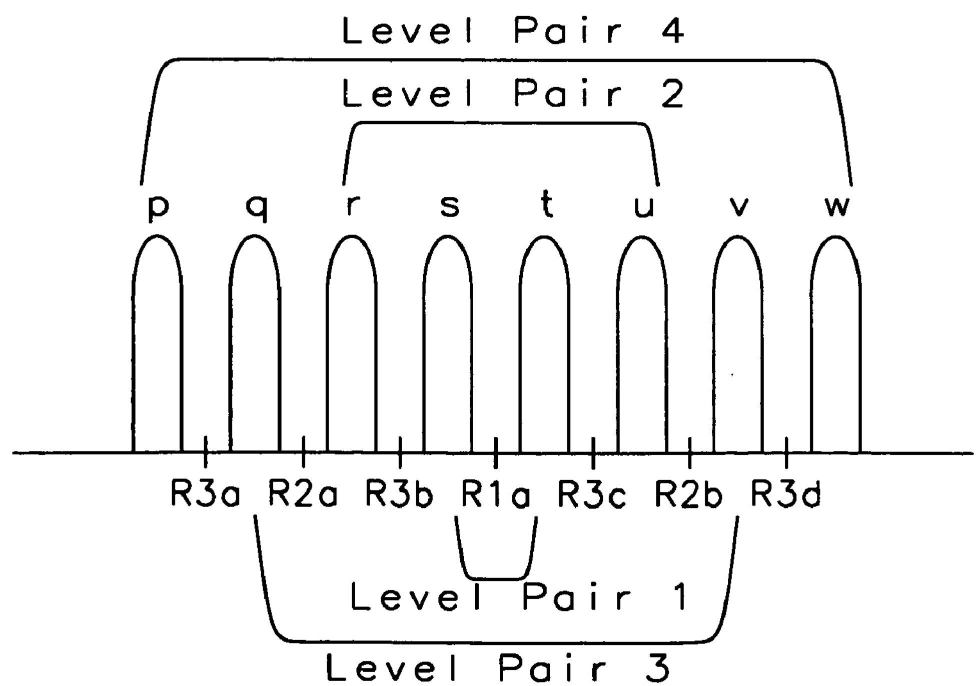
FIG. 19 shows a threshold distribution for 3-bit multi-level storage.
Figure 20:
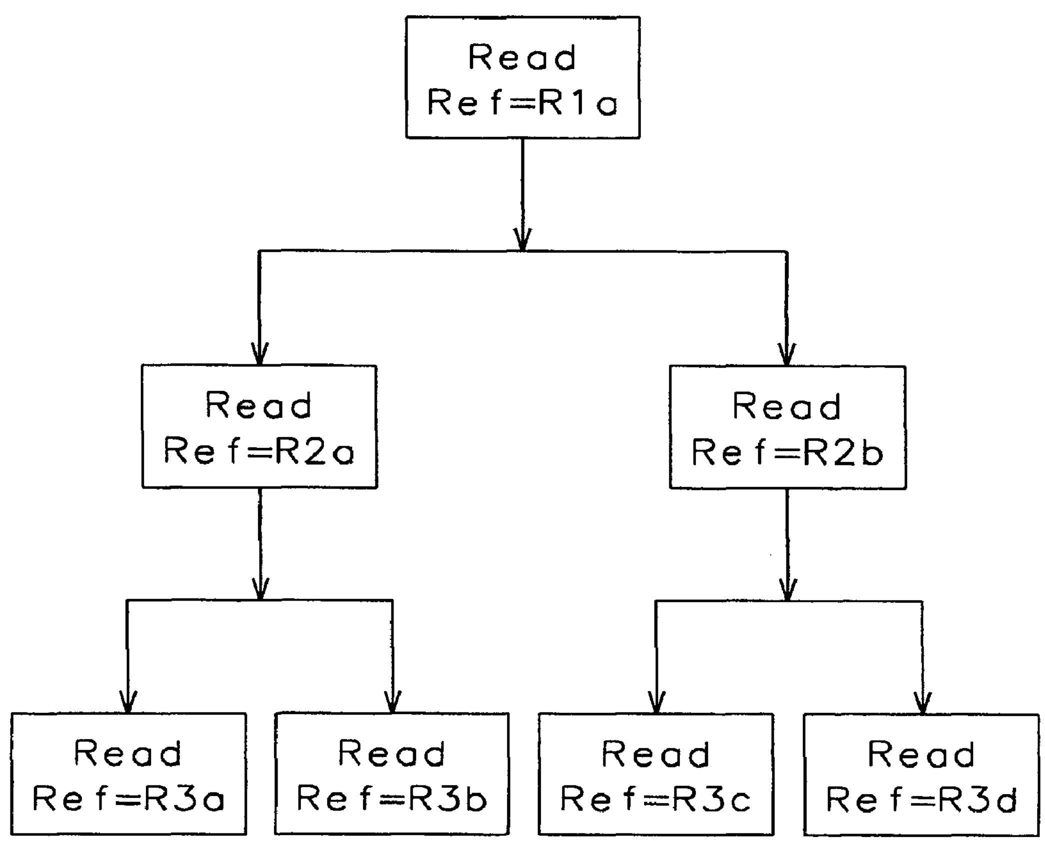
FIG. 20 shows a logical state diagram for sensing the 3-bit multi-level storage.

FIG. 19 shows how 3 bits of data could be stored in a single complementary pair. Eight levels are grouped into 4 pairs, and the read would be performed in 3 successive steps. The logical state diagram is given in FIG. 20.

In the complementary multi-level method of the invention, the data is complementary and the complementary data is compared against itself, in the first and second steps. The first step determines which cell is higher, and then the second step determines if the high cell is above the higher VT, and if the low cell is below the lowest VT. The multi-level complementary helps improve the area density to that of non-complementary single level data, while having the benefits of a well matched, tracking with cycling, self-referenced data.

Program of the distributions for multi-level complementary can be controlled by factors of time, or number of pulses, or control gate voltage or drain voltage, as well as current. It is recommended that, especially for multi-level complementary, the initial delta Vt between the two cells in a pair be as close to 0 as possible, either by careful programming, or by choosing the physical pair groups to best match the Vt characteristics, or by minimizing or matching the plasma charging during processing.

The present invention comprises three embodiments: two memory cells in a physical complementary pair, a complementary pair of reference cells for each erase block, and a physical complementary pair storing multiple data bits. The present invention addresses retention loss for greater sensing margin and faster read, especially for trap-type memories.

What is claimed is:

1. A method of complementary pairing of memory cells comprising:

providing two physical memory cells in a complementary pair, wherein said memory cells comprise nitride charge trap/insulator data storage, and wherein when a first of said memory cells in said complementary pair is programmed, a second of said memory cells in said complementary pair is erased and vice versa;

performing an initialization sequence on said complementary pair to minimize the threshold voltage offset between said two cells in said complementary pair, said initialization sequence comprising:

cycling together said complementary pair an N number of times wherein said cycling stabilizes program/erase operations;

thereafter, programming both memory cells in said complementary pairs; and thereafter, if a difference between a first threshold voltage of one of said complementary pair and a second threshold voltage of the other of said complementary pair is greater than a given tolerance, then the memory cell with the lower threshold voltage is slightly programmed further until said difference is less than said given tolerance; and comparing said two cells in said complementary pair with each other using a sense amplifier to determine if the first or the second of said memory cells in said complementary pair is programmed or erased.

2. The method according to claim 1 wherein said memory cells are non-volatile memory cells.

3. The method according to claim 1 wherein a first sensing margin after one million program and erase cycles of said two memory cells in said complementary pair is wider than a second sensing margin after one million program and erase cycles of a similar memory cell not in a complementary pair.

4. The method according to claim 1 wherein said first and second memory cells are connected to two separate bit lines.

5. The method according to claim 4 wherein said two bit lines are compared against each other by said sense amplifier.

6. The method according to claim 1 wherein N is between 0 and 20.

* * * * *